(12) United States Patent
Hatfield et al.

(10) Patent No.: US 12,313,422 B2
(45) Date of Patent: May 27, 2025

(54) ELECTRONIC MAP ENGAGEMENT FOR EFFECTIVE VEHICLE-TO-INFRASTRUCTURE NETWORK

(71) Applicant: INTERNATIONAL BUSINESS MACHINES CORPORATION, Armonk, NY (US)

(72) Inventors: Jennifer M. Hatfield, Portland, OR (US); Jeremy R. Fox, Georgetown, TX (US); Tushar Agrawal, West Fargo, ND (US); Sarbajit K. Rakshit, Kolkata (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 188 days.

(21) Appl. No.: 18/297,184

(22) Filed: Apr. 7, 2023

(65) Prior Publication Data
US 2024/0337501 A1    Oct. 10, 2024

(51) Int. Cl.
*G01C 21/36* (2006.01)
*G01C 21/34* (2006.01)

(52) U.S. Cl.
CPC ....... *G01C 21/367* (2013.01); *G01C 21/3492* (2013.01)

(58) Field of Classification Search
CPC .............. G01C 21/367; G01C 21/3492; G01C 21/3841
See application file for complete search history.

(56) References Cited

U.S. PATENT DOCUMENTS 9,571,827 B2   2/2017   Su
10,595,175 B2  3/2020   Ramalho De Oliveira
(Continued)

FOREIGN PATENT DOCUMENTS

CN   113645201 A  * 11/2021
CN   114758495 A  *  7/2022   ........... G08G 1/0129
(Continued)

OTHER PUBLICATIONS

Machine Translation of CN-114758495-A (Year: 2022).*
(Continued)

*Primary Examiner* — Sahar Motazedi
(74) *Attorney, Agent, or Firm* — Robert R. Aragona

(57) ABSTRACT

An embodiment for engaging with an electronic map for an effective vehicle-to-infrastructure (V2I) network is provided. The embodiment may include receiving real-time and historical data from one or more IoT devices and an electronic map of one or more roadways. The embodiment may also include identifying one or more characteristics associated with the one or more roadways. The embodiment may further include identifying one or more driving conditions of each roadway in the electronic map and capabilities of one or more vehicles. The embodiment may also include executing a digital twin simulation of a digital twin model of each vehicle driving along the one or more roadways. The embodiment may further include in response to determining at least one vehicle is unable to make a driving decision, recommending a relative location of one or more infrastructure devices on the one or more roadways.

17 Claims, 4 Drawing Sheets

(56) References Cited

U.S. PATENT DOCUMENTS

| | | | |
|---|---|---|---|
| 10,628,931 | B1 | 4/2020 | Ramos |
| 10,743,198 | B1* | 8/2020 | Park .......................... G08G 1/08 |
| 2018/0283897 | A1 | 10/2018 | Wang |
| 2019/0035268 | A1 | 1/2019 | Madigan |
| 2019/0043348 | A1* | 2/2019 | Eno .................. G08G 1/096827 |
| 2019/0066409 | A1 | 2/2019 | Moreira Da Mota |
| 2019/0108749 | A1* | 4/2019 | Gaither ................ G08G 1/0137 |
| 2020/0249041 | A1* | 8/2020 | Begleiter ........... G01C 21/3492 |
| 2021/0042882 | A1 | 2/2021 | Kim |
| 2021/0104160 | A1* | 4/2021 | Gao ....................... G06Q 10/02 |
| 2021/0150888 | A1* | 5/2021 | Vanderkam .......... G08G 1/0133 |
| 2021/0182604 | A1* | 6/2021 | Anthony .............. G08G 1/0141 |

FOREIGN PATENT DOCUMENTS

| | | | | |
|---|---|---|---|---|
| CN | 115593433 A | * | 1/2023 | |
| WO | WO-2021053393 A1 | * | 3/2021 | ............ B60W 40/04 |

OTHER PUBLICATIONS

Machine Translation of CN-113645201-A (Year: 2021).*

Machine Translation of CN-115593433-A (Year: 2023).*

Disclosed Anonymously, "Updating Electronic Map with Real-Time Volumetric Video for Effective Driving", IP.com, IPCOM000270860D, Sep. 2, 2022, 4 Pages.

IBM, "IBM 5G and edge computing", IBM.com, [accessed on Jan. 5, 2023], 24 pages. Retrieved from Internet: <https://www.ibm.com/downloads/cas/0WOR6ORJ>.

Lei, "Generative Adversarial Network technology: AI goes mainstream", IBM, https://www.ibm.com/blogs/systems/generative adversarial-network-tec, Sep. 17, 2019, 5 Pages.

* cited by examiner

ELECTRONIC MAP ENGAGEMENT FOR EFFECTIVE VEHICLE-TO-INFRASTRUCTURE NETWORK

BACKGROUND

The present invention relates generally to the field of computing, and more particularly to a system for engaging with an electronic map for an effective vehicle-to-infrastructure (V2I) network.

In any city, there may be different types of roads and crossings for vehicles. Vehicle to everything (V2X) is a vehicular communication system that supports the transfer of information from a vehicle to an external device that may affect or be affected by the movement of the vehicle. V2X technology may be used to improve road safety, save energy and resources, and promote traffic efficiency. For example, a vehicle may communicate with another vehicle, an external computing system, a pedestrian, and/or a traffic signal (e.g., a traffic light and/or stop sign). As technology continues to improve, the demand for V2X, and specifically V2I, is expected to increase in the coming decades.

SUMMARY

According to one embodiment, a method, computer system, and computer program product for engaging with an electronic map for an effective vehicle-to-infrastructure (V2I) network is provided. The embodiment may include receiving real-time and historical data from one or more IoT devices and an electronic map of one or more roadways. The embodiment may also include identifying one or more characteristics associated with the one or more roadways based on an engagement with the electronic map. The embodiment may further include identifying one or more driving conditions of each roadway in the electronic map and capabilities of one or more vehicles based on the real-time and the historical data. The embodiment may also include executing a digital twin simulation of a digital twin model of each vehicle driving along the one or more roadways in accordance with the one or more characteristics and the one or more driving conditions. The embodiment may further include in response to determining at least one vehicle is unable to make a driving decision, recommending a relative location of one or more infrastructure devices on the one or more roadways based on the capabilities of the one or more vehicles.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
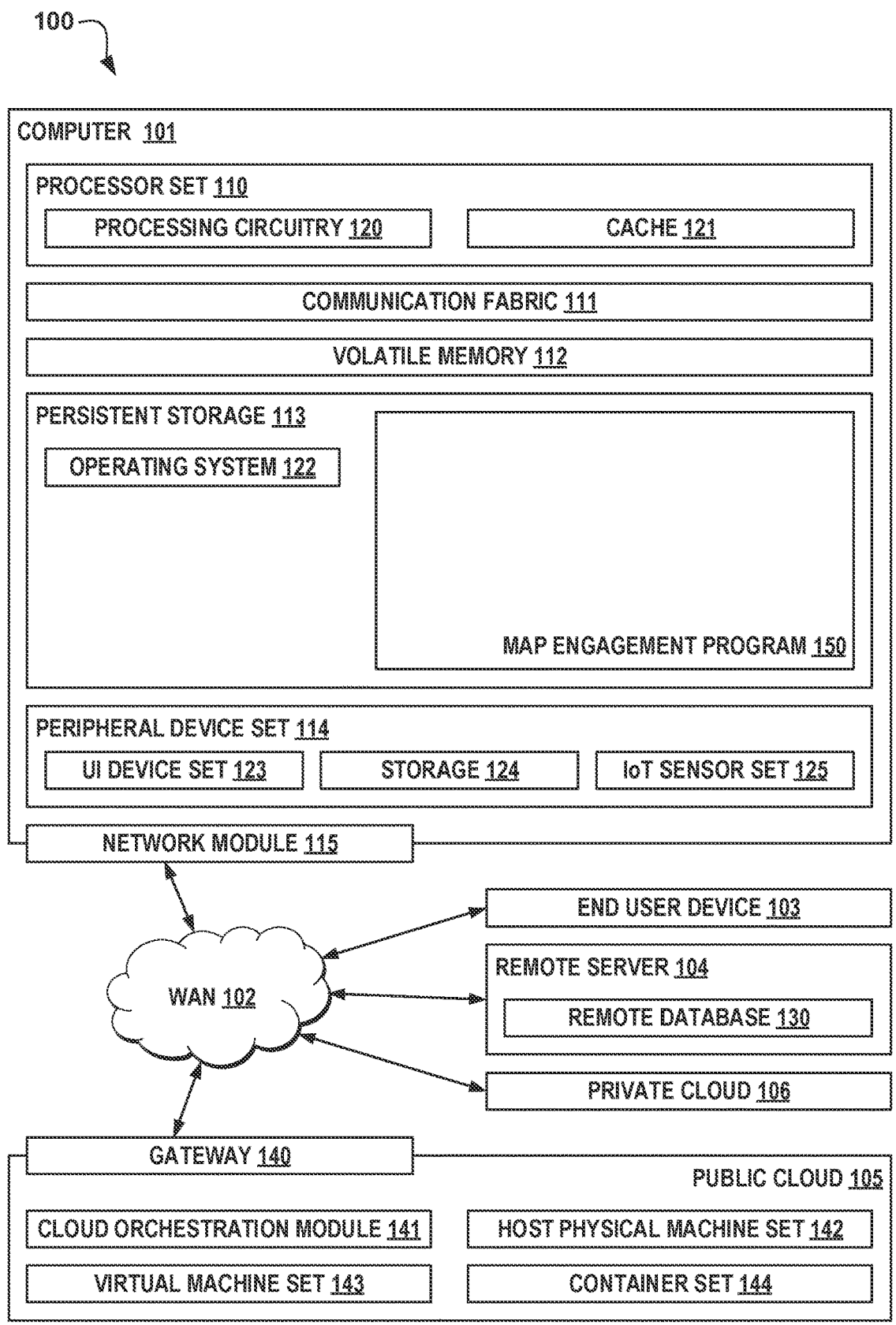
FIG. 1 illustrates an exemplary computing environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

Embodiments of the present invention relate to the field of computing, and more particularly to a system for engaging with an electronic map for an effective vehicle-to-infrastructure (V2I) network. The following described exemplary embodiments provide a system, method, and program product to, among other things, execute a digital twin simulation of a digital twin model of each vehicle driving along one or more roadways in accordance with one or more characteristics and one or more driving conditions and, accordingly, recommend a relative location of one or more infrastructure devices along the one or more roadways based on vehicle capabilities. Therefore, the present embodiment has the capacity to improve traffic management technology and infrastructure by increasing communication capability between vehicles and surrounding infrastructure.

As previously described, in any city, there may be different types of roads and crossings for vehicles. Vehicle to everything (V2X) is a vehicular communication system that supports the transfer of information from a vehicle to an external device that may affect or be affected by the movement of the vehicle. V2X technology may be used to improve road safety, save energy and resources, and promote traffic efficiency. For example, a vehicle may communicate with another vehicle, an external computing system, a pedestrian, and/or a traffic signal (e.g., a traffic light and/or stop sign). As technology continues to improve, the demand for V2X, and specifically V2I, is expected to increase in the coming decades. In various contextual situations, the surrounding infrastructure may not be able to communicate with the vehicle. This problem is typically addressed by alerting a user, such as a driver, about traffic accidents on a roadway based on a route and location of the vehicle. However, simply alerting the user about traffic accidents fails to proactively predict proper placement of infrastructure on the roadway.

It may therefore be imperative to have a system in place to enable vehicles to effectively communicate with surrounding infrastructure to support a driving decision. Thus, embodiments of the present invention may provide advantages including, but not limited to, enabling vehicles to effectively communicate with surrounding infrastructure to support a driving decision, assigning the vehicles to a most compatible route, and increasing traffic safety. The present invention does not require that all advantages need to be incorporated into every embodiment of the invention.

According to at least one embodiment, when vehicles are driving along one or more roadways, real-time and historical data from one or more internet of things (IoT) devices and an electronic map of the one or more roadways may be received in order to identify one or more characteristics associated with the one or more roadways based on an engagement with the electronic map. According to at least one embodiment, the characteristic may be a curvature of the one or more roadways. According to at least one other embodiment, the characteristic may be an intersection angle of the one or more roadways. According to at least one further embodiment, the characteristic may be dimensions of the one or more roadways. Upon identifying the one or more characteristics, one or more driving conditions of each roadway in the electronic map and capabilities of one or more vehicles may be identified based on the real-time and the historical data so that a digital twin simulation of a digital twin model of each vehicle driving along the one or more roadways may be executed in accordance with the one or more characteristics and the one or more driving conditions. Then, it may be determined whether at least one vehicle is unable to make a driving decision based on the executed digital twin simulation. In response to determining the at least one vehicle is unable to make the driving decision, a relative location of one or more infrastructure devices on the one or more roadways may be recommended based on the capabilities of the one or more vehicles. Upon recommending the relative location, aggregated capabilities of multiple vehicles driving along the one or more roadways may be identified in order to assign each vehicle of the multiple vehicles to an optimized route based on the aggregated capabilities.

According to at least one other embodiment, upon installation of the one or more infrastructure devices, the recommendation may be validated by executing an updated digital twin simulation of the digital twin model of each vehicle driving along the one or more roadways in accordance with current traffic patterns and current communication with the one or more infrastructure devices. Then, one or more upgrades to the one or more infrastructure devices may be predicted based on a continuous monitoring of new vehicle capabilities.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The following described exemplary embodiments provide a system, method, and program product to execute a digital twin simulation of a digital twin model of each vehicle driving along one or more roadways in accordance with one or more characteristics and one or more driving conditions and, accordingly, recommend a relative location of one or more infrastructure devices along the one or more roadways based on vehicle capabilities.

Referring to FIG. 1, an exemplary computing environment 100 is depicted, according to at least one embodiment. Computing environment 100 contains an example of an environment for the execution of at least some of the computer code involved in performing the inventive methods, such as an electronic map engagement program 150. In addition to block 150, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory 112 is characterized by random access, but this is not required unless affirmatively indicated. In computer 101, the volatile memory 112 is located in a single package and is internal to computer 101, but, alternatively or additionally, the volatile memory 112 may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage 113 allows writing of data, deletion of data and re-writing of data. Some familiar forms of persistent storage 113 include magnetic disks and solid state storage devices. Operating system 122 may take several forms, such as various known proprietary operating systems or open source Portable Operating System Interface type operating systems that employ a kernel. The code included in block 150 typically includes at least some of the computer code involved in performing the inventive methods.

Peripheral device set 114 includes the set of peripheral devices of computer 101. Data communication connections between the peripheral devices 114 and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database), this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector. Peripheral device set 114 may also include a vehicle, a GPS device, a camera, a traffic signal (e.g., a stop sign and/or traffic light), and/or any other infrastructure device capable of communicating with the vehicle.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN 102 and/or LANs typically include computer hardware such as copper transmission cables, optical transmission fibers, wireless transmission, routers, firewalls, switches, gateway computers and edge servers.

End user device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments the private cloud 106 may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

According to the present embodiment, the electronic map engagement program 150 may be a program capable of receiving real-time and historical data from one or more IoT devices and an electronic map of one or more roadways, executing a digital twin simulation of a digital twin model of each vehicle driving along one or more roadways in accordance with one or more characteristics and one or more driving conditions, recommending a relative location of one or more infrastructure devices along the one or more roadways based on vehicle capabilities, enabling vehicles to effectively communicate with surrounding infrastructure to support a driving decision, assigning the vehicles to a most compatible route, and increasing traffic safety. Furthermore, notwithstanding depiction in computer 101, the electronic map engagement program 150 may be stored in and/or executed by, individually or in any combination, end user device 103, remote server 104, public cloud 105, and private cloud 106. The electronic map engagement method is explained in further detail below with respect to FIGS. 2A and 2B. It may be appreciated that the examples described below are not intended to be limiting, and that in embodiments of the present invention the parameters used in the examples may be different.

Figure 2A:
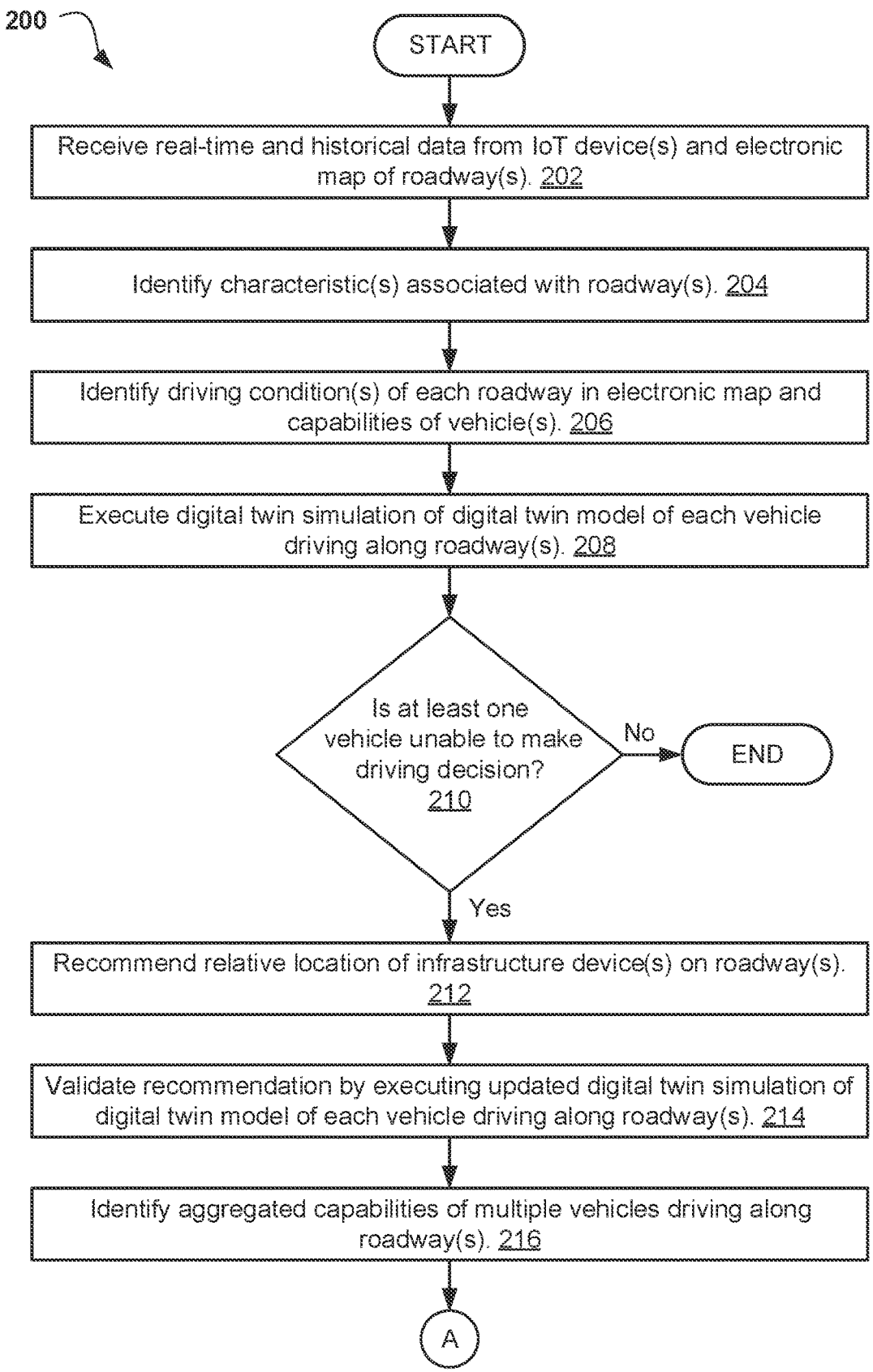
FIGS. 2A and 2B illustrate an operational flowchart for engaging with an electronic map for an effective vehicle-to-infrastructure (V2I) network in an electronic map engagement process according to at least one embodiment.
Figure 2B:
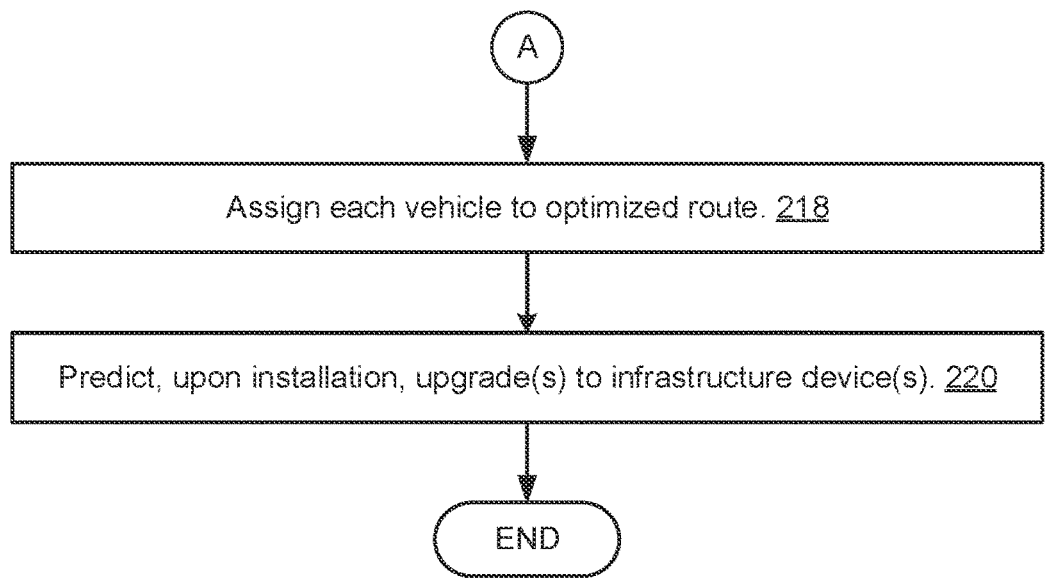

Referring now to FIGS. 2A and 2B, an operational flowchart for engaging with an electronic map for an effective vehicle-to-infrastructure (V2I) network in an electronic map engagement process 200 is depicted according to at least one embodiment. At 202, the electronic map engagement program 150 receives the real-time and the historical data from the one or more IoT devices and the electronic map of the one or more roadways. Examples of the IoT device may include, but are not limited to, a vehicle (e.g., an autonomous or manually driven vehicle), a GPS device, a camera, a traffic signal (e.g., a stop sign and/or traffic light), and/or any other IoT device capable of communicating with the vehicle. The one or more IoT devices may be placed in different locations along multiple roadways in a given geographical area (e.g., the Washington, D.C. metropolitan area).

The one or more IoT devices may be utilized by the electronic map engagement program 150 to capture data on the plurality of roadways. The data may include, but is not limited to, traffic conditions, roadway conditions (e.g., potholes and/or surface type), speed of vehicles traveling along the multiple roadways, weather conditions, and/or roadway visibility. For example, a camera and/or an autonomous vehicle may detect that a roadway has limited visibility due to a sharp curve along the roadway. As described above, the data is collected in real-time and historically. The historical data may be input into and retrieved from a knowledge corpus and/or a database, such as remote database 130. In this manner, the real-time data becomes the historical data upon being input into the AI knowledge corpus and/or the database 130.

The electronic map may be a digital map of one or more roadways in a geographic area. The geographic area may be a major city, a suburb, a town, and/or a rural village. The electronic map engagement program 150 may engage with the electronic map to identify the one or more characteristics associated with the one or more roadways, described in further detail below with respect to step 204.

Then, at 204, the electronic map engagement program 150 identifies the one or more characteristics associated with the one or more roadways. The one or more characteristics are identified based on the engagement with the electronic map. For example, the electronic map engagement program 150 may perform image analysis and/or other computer vision techniques on the electronic map. Examples of a characteristic may include, but are not limited to, a curvature of the one or more roadways, an intersection angle of the one or more roadways, dimensions of the one or more roadways (e.g., width and length), and/or a direction of vehicle movement (e.g., a one-way roadway or two-way roadway). For example, roadway "A" may intersect with roadway "B" at a 45° angle, and roadway "B" may intersect with roadway "C" at a 90° angle. In another example, roadway "A" may be two miles long and 20 feet wide.

Next, at 206, the electronic map engagement program 150 identifies the one or more driving conditions of each roadway in the electronic map and the capabilities of the one or more vehicles. The one or more driving conditions and the capabilities are identified based on the real-time and the historical data.

As described above with respect to step 202, the data captured by the one or more IoT devices along the multiple roadways may include, but is not limited to, traffic conditions, roadway conditions (e.g., potholes and/or surface type), speed of vehicles traveling along the multiple roadways, weather conditions, and/or roadway visibility. The real-time and the historical data captured in step 202 may be parsed (i.e., divided) by the electronic map engagement program 150 into data for each roadway in the electronic map. For example, with respect to step 202, the real-time and the historical data may be captured for the multiple roadways in a given geographical area (e.g., the Washington, D.C. metropolitan area). Continuing the example, the electronic map may only include the one or more roadways in a portion of the geographical area (e.g., roadway "A", roadway "B", and roadway "C"). Therefore, in this example, roadway "A", roadway "B", and roadway "C" are the roadways in the electronic map, and thus the one or more roadways for which the one or more driving conditions are identified. Continuing the example, roadway "A" may be a paved roadway having heavy traffic during weekday rush hours, roadway "B" may be an unpaved roadway having potholes and curves which restrict the visibility ahead of a driver or autonomous vehicle.

According to at least one embodiment, the capabilities of the one or more vehicles may include, but are not limited to, self-driving capability, enhanced driving features (e.g., adaptive cruise control), a heads-up display, an augmented reality (AR) windshield, Wi-Fi, and/or an electric motor. The capabilities may be utilized to recommend the relative location of the one or more infrastructure devices on the one or more roadways, described in further detail below with respect to step 212.

Then, at 208, the electronic map engagement program 150 executes the digital twin simulation of the digital twin model of each vehicle driving along the one or more roadways. The digital twin simulation is executed in accordance with the one or more characteristics and the one or more driving conditions. The electronic map engagement program 150 may use known techniques to create the digital twin model of each vehicle driving along the one or more roadways in the electronic map, and this digital twin model may be used in the digital twin simulation. The digital twin of each vehicle used in the simulation may have the same capabilities each vehicle has in the real-world. For example, a car having autonomous driving capabilities and a heads-up display in the real-world may have a digital twin with the same capabilities.

The digital twin simulation of different scenarios may be executed consistent with the one or more characteristics and the one or more driving conditions in the real-world. For example, where the characteristics of roadway "A" in the real-world include an intersecting angle with roadway "B" of 45°, a length of two miles long and a width of 20 feet, then roadway "A" in the digital twin simulation may have the same characteristics. Continuing the example, where the driving conditions of roadway "A" in the real-world include a paved roadway, heavy traffic during weekday rush hours, and a typical vehicle speed of 40 MPH, then roadway "A" in the digital twin simulation may have the same driving conditions. In this manner, maximum accuracy may be preserved during the digital twin simulation.

Next, at 210, the electronic map engagement program 150 determines whether the at least one vehicle is unable to make the driving decision. The determination is made based on the executed digital twin simulation. Examples of a driving decision may include, but are not limited to, turns, brakes, acceleration, and/or maintain speed. As described above with respect to step 208, the digital twin of each vehicle used in the simulation may have the same capabilities each vehicle has in the real-world. Due to limited capabilities of the at least one vehicle, the one or more characteristics, and the one or more driving conditions, the at least one vehicle may be unable to make the driving decision during the digital twin simulation.

For example, due to the curves along roadway "B" which restrict the visibility ahead of a driver or autonomous vehicle, the at least one vehicle may not be able to apply the brakes for an unseen object that is crossing the roadway. Such a situation may cause an accident during the digital twin simulation. In another example, due to potholes and flooding along roadway "B", and due to roadway "B" being a narrow roadway, the at least one vehicle may not be able to turn to avoid a pool of water. Such a situation may cause the at least one vehicle to hydroplane.

According to at least one embodiment, based on the various scenarios described above which may be simulated during the digital twin simulation, the electronic map engagement program 150 may be able to predict the types of infrastructure devices that are required for the at least one vehicle to make the driving decision. For example, a smart stop sign or traffic signal installed at the intersection ahead of the curve along roadway "B" may alert the at least one vehicle as to the existence of an intersection and signal the at least one vehicle to apply the brakes. In another example, a camera installed at a location on roadway "B" where flooding is typical may alert the at least one vehicle as to the existence of the flood and signal the vehicle to either turn or apply the brakes.

In response to determining the at least one vehicle is unable to make the driving decision (step 210, "Yes" branch), the electronic map engagement process 200 proceeds to step 212 to recommend the relative location of the one or more infrastructure devices on the one or more roadways based on the capabilities of the one or more vehicles. In response to determining the at least one vehicle is not unable to make the driving decision (step 210, "No" branch), the electronic map engagement process 200 ends.

Then, at 212, the electronic map engagement program 150 recommends the relative location of the one or more infrastructure devices on the one or more roadways. The relative location is identified based on the capabilities of the one or more vehicles. As described above with respect to step 210, the electronic map engagement program 150 may be able to predict the types of infrastructure devices that are required for the at least one vehicle to make the driving decision. In addition to predicting the types of infrastructure devices required for the at least one vehicle to make the driving decision, the electronic map engagement program 150 may predict the relative location of the one or more infrastructure devices on the one or more roadways. For example, a smart all-way stop sign or traffic signal may be installed at the intersection of roadway "B" and roadway "C" ahead of the curve along roadway "B". In another example, a camera and/or one or more sensors may be installed at a location on roadway "B" where flooding is typical. Continuing the example, flooding on a portion of a roadway may be considered typical when that portion of the roadway floods more than 50% of the time when it rains or snows. Once the relative location of the one or more infrastructure devices is predicted, the relative location may be recommended via the electronic map, described in further detail below.

According to at least one embodiment, recommending the relative location of the one or more infrastructure devices may include identifying a directional alignment of the one or more infrastructure devices. The directional alignment may be identified based on the identified one or more characteristics associated with the one or more roadways. For example, where roadway "B" is a one-way roadway, the smart stop sign or traffic signal should be installed facing the opposite direction of the flow of traffic. In this manner, the smart stop sign or traffic signal could be seen by the one or more vehicles.

Figure 3:
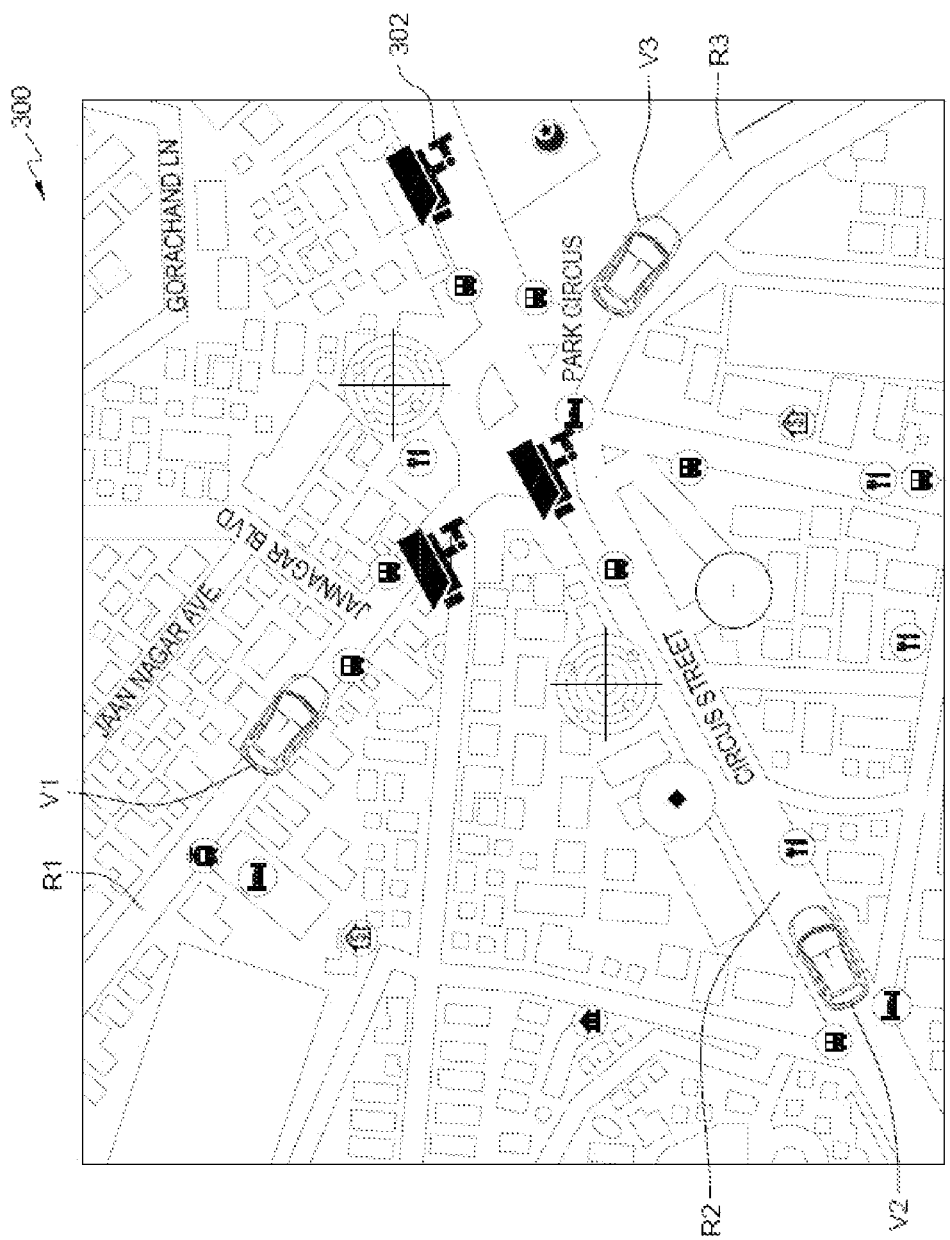
FIG. 3 is an exemplary diagram depicting vehicles traveling along roadways and the population of the electronic map with recommended infrastructure devices according to at least one embodiment.

According to at least one other embodiment, recommending the relative location of the one or more infrastructure devices may also include augmenting the electronic map with a digital image overlay of the one or more infrastructure devices. The digital image overlay may be displayed on the electronic map at the recommended relative location, as illustrated in FIG. 3 and described in further detail below with respect to the description of FIG. 3. For example, a digital image overlay of the smart stop sign or traffic signal may be populated onto the electronic map at the recommended relative location of the smart stop sign or traffic signal in accordance with the identified directional alignment. The augmented electronic map may be displayed to a driver or passengers inside the one or more vehicles and/or to a city planner to provide the recommended relative location.

Next, at 214, the electronic map engagement program 150 validates, upon the installation of the one or more infrastructure devices, the recommendation. The recommendation is validated by executing an updated digital twin simulation of the digital twin model of each vehicle driving along the one or more roadways in accordance with the current traffic patterns and the current communication between with the one or more infrastructure devices. The updated digital twin simulation may validate the recommendation made in step 212 and, according to at least one embodiment, may be executed after the one or more infrastructure devices have been installed on the one or more roadways. In response to determining the at least one vehicle is still unable to make the driving decision after the one or more infrastructure devices have been installed, the execution of the updated digital twin simulation may be iterated with an updated recommendation of the relative location of the one or more infrastructure devices. For example, where the at least one vehicle is communicating with a smart stop sign in the real-world that has been installed at the intersection of roadway "B" and roadway "C", the at least one vehicle may still be unable to make the driving decision. Continuing the example, the updated digital twin simulation may be executed with a smart traffic signal at the intersection instead of the smart stop sign to determine whether the at least one vehicle is able to make the driving decision by communicating with the smart traffic signal. The recommendation may be validated when the at least one vehicle is able to make the driving decision.

Then, at 216, the electronic map engagement program 150 identifies the aggregated capabilities of the multiple vehicles driving along the one or more roadways. As described above with respect to step 206, the capabilities of the one or more vehicles may include, but are not limited to, self-driving capability, enhanced driving features (e.g., adaptive cruise control), a heads-up display, an AR windshield, Wi-Fi, and/or an electric motor. However, not all vehicles have the same capabilities. For example, a first vehicle travelling along roadway "A" may have an AR windshield and Wi-Fi, while a second vehicle travelling along roadway "B" may have adaptive cruise control and an electric motor. The electronic map engagement program 150 may aggregate the individual capabilities of the multiple vehicles. In the example described above, the electronic map engagement program 150 may identify the aggregated capabilities of the first vehicle and the second vehicle as including the AR windshield, Wi-Fi, adaptive cruise control, and the electric motor. The aggregated capabilities may be utilized to assign each vehicle to an optimized route, described in further detail below with respect to step 218.

Next, at 218, the electronic map engagement program 150 assigns each vehicle of the multiple vehicles to the optimized route. Each vehicle may be assigned to the optimized route based on the aggregated capabilities. As used herein, an "optimized route" is a most suitable route for each vehicle considering the currently available infrastructure (i.e., before the recommended one or more infrastructure devices are actually installed) and the aggregated capabilities. Depending upon the currently available infrastructure on the one or more roadways, different roadways may be more suitable for one vehicle than for another vehicle.

Continuing the example described above, the first vehicle travelling along roadway "A" may have an AR windshield and Wi-Fi and the second vehicle travelling along roadway "B" may have adaptive cruise control and an electric motor. However, due to roadway "B" being an unpaved roadway having potholes and curves which restrict the visibility, roadway "B" may not be optimal for the second vehicle relying on adaptive cruise control to make the driving decision. Additionally, roadway "A" may not be optimal for the second vehicle since the second vehicle does not have Wi-Fi to communicate with the currently available infrastructure. However, assuming the second vehicle has the capability to communicate with the first vehicle via vehicle-to-vehicle (V2V) communication, the first vehicle and the second vehicle may be assigned to roadway "A". In this manner, by aggregating the capabilities of the first vehicle and the second vehicle, the second vehicle may utilize the first vehicle as an intermediary to communicate with the currently available infrastructure on roadway "A".

Then, at 220, the electronic map engagement program 150 predicts, upon the installation of the one or more infrastructure devices, the one or more upgrades to the one or more infrastructure devices. The one or more upgrades may be predicted based on the continuous monitoring of the new vehicle capabilities. As technology improves over time, vehicles may have increased capabilities. In addition to identifying the capabilities of the one or more vehicles, as described above with respect to step 206, the electronic map engagement program 150 may continuously monitor newer vehicles for the new capabilities. For example, a car manufactured in 2023 may have more capabilities (e.g., a 5G wireless network as opposed to a 4G wireless network) than another car manufactured in 2018. Thus, the one or more infrastructure devices that are installed may need to be upgraded to meet the demands of these newer vehicles. Continuing the example described above, for a previously installed smart stop sign and/or traffic light, the predicted upgrade may include upgrading the smart stop sign and/or traffic light to be compatible with 5G. The predicted one or more upgrades may be displayed in the same manner as described above with respect to step 212.

Referring now to FIG. 3, an exemplary diagram 300 depicting vehicles V1, V2, V3 traveling along roadways R1, R2, R3 and the population of the electronic map with recommended infrastructure devices 302 is shown according to at least one embodiment. In the diagram 300, the electronic map may include a plurality of roadways, including roadways R1, R2, R3 on which vehicles V1, V2, V3 are travelling, respectively. The electronic map may be engaged with to identify the characteristics associated with the plurality of roadways, including the roadways R1, R2, R3. The vehicles V1, V2, V3 travelling on the roadways R1, R2, R3, respectively, may have varying capabilities, which may be used by the electronic map engagement program 150 (FIG. 1) to identify the relative location of the recommended infrastructure devices 302. As depicted in the diagram 300, the electronic map may be augmented with a digital image overlay of the recommended infrastructure devices 302. For example, the recommended infrastructure devices 302 may be a plurality of cameras displayed on the electronic map at the recommended relative location. The augmented electronic map may then be displayed to a driver or passengers inside the vehicles V1, V2, V3 and/or to a city planner to provide the recommended relative location.

It may be appreciated that FIGS. 2A, 2B, and 3 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-based method of engaging with an electronic map for an effective vehicle-to-infrastructure (V2I) network, the method comprising:
   receiving (i) real-time and historical data from one or more internet of things (IoT) devices and (ii) an electronic map of one or more roadways;
   identifying one or more characteristics associated with the one or more roadways based on an engagement with the electronic map;
   identifying, based on the real-time and historical data, one or more driving conditions of each roadway in the electronic map and capabilities of one or more vehicles driving along the one or more roadways;
   executing a digital twin simulation of a digital twin model of each vehicle of the one or more vehicles driving along the one or more roadways in accordance with the one or more characteristics and the one or more driving conditions, wherein the digital twin model of each vehicle used in the executed digital twin simulation has identical capabilities to the corresponding vehicle of the one or more vehicles driving along the one or more roadways and the executed digital twin simulation has identical characteristics and driving conditions to a corresponding roadway on which the one or more vehicles are driving;
   determining whether the digital twin model of at least one vehicle of the one or more vehicles is unable to make a driving decision based on the executed digital twin simulation;
   in response to determining the digital twin model of the at least one vehicle is unable to make the driving decision, recommending a location of one or more infrastructure devices on the one or more roadways based on the capabilities of the one or more vehicles;
   identifying aggregated capabilities of multiple vehicles driving along the one or more roadways; and
   assigning each vehicle of the multiple vehicles to an optimized route based on the aggregated capabilities and the one or more infrastructure devices, wherein assigning each vehicle to the optimized route further comprises:
     based on determining a first vehicle driving along a first roadway has a Wi-Fi capability and a second vehicle driving along a second roadway has a vehicle-to-vehicle (V2V) communication capability:
       causing the second vehicle driving along the second roadway to reroute to the first roadway so that the second vehicle uses the first vehicle as an intermediary to communicate with the one or more infrastructure devices.

2. The computer-based method of claim 1, further comprising:
   validating, upon installation of the one or more infrastructure devices, the recommended location by executing an updated digital twin simulation of the digital twin model of each vehicle of the one or more vehicles driving along the one or more roadways in accordance with current traffic patterns and current communication with the one or more infrastructure devices.

3. The computer-based method of claim 1, further comprising:
predicting, upon installation of the one or more infrastructure devices, one or more upgrades to the one or more infrastructure devices based on a continuous monitoring of new vehicle capabilities.

4. The computer-based method of claim 1, wherein recommending the location of the one or more infrastructure devices further comprises:
identifying a directional alignment of the one or more infrastructure devices based on the identified one or more characteristics associated with the one or more roadways.

5. The computer-based method of claim 1, wherein recommending the location of the one or more infrastructure devices further comprises:
augmenting the electronic map with a digital image overlay of the one or more infrastructure devices, wherein the digital image overlay is displayed on the electronic map at the recommended location.

6. The computer-based method of claim 1, wherein the one or more characteristics associated with the one or more roadways are selected from a group consisting of a curvature of the one or more roadways, an intersection angle of the one or more roadways, and dimensions of the one or more roadways.

7. A computer system, the computer system comprising:
one or more processors, one or more computer-readable memories, one or more computer-readable tangible storage medium, and program instructions stored on at least one of the one or more computer-readable tangible storage medium for execution by at least one of the one or more processors via at least one of the one or more computer-readable memories, wherein the computer system is capable of performing a method comprising:
receiving (i) real-time and historical data from one or more internet of things (IoT) devices and (ii) an electronic map of one or more roadways;
identifying one or more characteristics associated with the one or more roadways based on an engagement with the electronic map;
identifying, based on the real-time and historical data, one or more driving conditions of each roadway in the electronic map and capabilities of one or more vehicles driving along the one or more roadways;
executing a digital twin simulation of a digital twin model of each vehicle of the one or more vehicles driving along the one or more roadways in accordance with the one or more characteristics and the one or more driving conditions, wherein the digital twin model of each vehicle used in the executed digital twin simulation has identical capabilities to the corresponding vehicle of the one or more vehicles driving along the one or more roadways and the executed digital twin simulation has identical characteristics and driving conditions to a corresponding roadway on which the one or more vehicles are driving;
determining whether the digital twin model of at least one vehicle of the one or more vehicles is unable to make a driving decision based on the executed digital twin simulation;
in response to determining the digital twin model of the at least one vehicle is unable to make the driving decision, recommending a location of one or more infrastructure devices on the one or more roadways based on the capabilities of the one or more vehicles;
identifying aggregated capabilities of multiple vehicles driving along the one or more roadways; and
assigning each vehicle of the multiple vehicles to an optimized route based on the aggregated capabilities and the one or more infrastructure devices, wherein assigning each vehicle to the optimized route further comprises:
based on determining a first vehicle driving along a first roadway has a Wi-Fi capability and a second vehicle driving along a second roadway has a vehicle-to-vehicle (V2V) communication capability:
causing the second vehicle driving along the second roadway to reroute to the first roadway so that the second vehicle uses the first vehicle as an intermediary to communicate with the one or more infrastructure devices.

8. The computer system of claim 7, the method further comprising:
validating, upon installation of the one or more infrastructure devices, the recommended location by executing an updated digital twin simulation of the digital twin model of each vehicle of the one or more vehicles driving along the one or more roadways in accordance with current traffic patterns and current communication with the one or more infrastructure devices.

9. The computer system of claim 7, the method further comprising:
predicting, upon installation of the one or more infrastructure devices, one or more upgrades to the one or more infrastructure devices based on a continuous monitoring of new vehicle capabilities.

10. The computer system of claim 7, wherein recommending the location of the one or more infrastructure devices further comprises:
identifying a directional alignment of the one or more infrastructure devices based on the identified one or more characteristics associated with the one or more roadways.

11. The computer system of claim 7, wherein recommending the location of the one or more infrastructure devices further comprises:
augmenting the electronic map with a digital image overlay of the one or more infrastructure devices, wherein the digital image overlay is displayed on the electronic map at the recommended relative-location.

12. The computer system of claim 7, wherein the one or more characteristics associated with the one or more roadways are selected from a group consisting of a curvature of the one or more roadways, an intersection angle of the one or more roadways, and dimensions of the one or more roadways.

13. A computer program product, the computer program product comprising:
one or more computer-readable tangible storage medium and program instructions stored on at least one of the one or more computer-readable tangible storage medium, the program instructions executable by a processor capable of performing a method, the method comprising:
receiving (i) real-time and historical data from one or more internet of things (IoT) devices and (ii) an electronic map of one or more roadways;
identifying one or more characteristics associated with the one or more roadways based on an engagement with the electronic map;
identifying, based on the real-time and the historical data, one or more driving conditions of each roadway in the electronic map and capabilities of one or more vehicles driving along the one or more roadways;

executing a digital twin simulation of a digital twin model of each vehicle of the one or more vehicles driving along the one or more roadways in accordance with the one or more characteristics and the one or more driving conditions, wherein the digital twin model of each vehicle used in the executed digital twin simulation has identical capabilities to the corresponding vehicle of the one or more vehicles driving along the one or more roadways and the executed digital twin simulation has identical characteristics and driving conditions to a corresponding roadway on which the one or more vehicles are driving;

determining whether the digital twin model of at least one vehicle of the one or more vehicles is unable to make a driving decision based on the executed digital twin simulation;

in response to determining the digital twin model of the at least one vehicle is unable to make the driving decision, recommending a location of one or more infrastructure devices on the one or more roadways based on the capabilities of the one or more vehicles;

identifying aggregated capabilities of multiple vehicles driving along the one or more roadways; and assigning each vehicle of the multiple vehicles to an optimized route based on the aggregated capabilities and the one or more infrastructure devices, wherein assigning each vehicle to the optimized route further comprises:

based on determining a first vehicle driving along a first roadway has a Wi-Fi capability and a second vehicle driving along a second roadway has a vehicle-to-vehicle (V2V) communication capability:

causing the second vehicle driving along the second roadway to reroute to the first roadway so that the second vehicle uses the first vehicle as an intermediary to communicate with the one or more infrastructure devices.

14. The computer program product of claim 13, the method further comprising:

validating, upon installation of the one or more infrastructure devices, the recommended location by executing an updated digital twin simulation of the digital twin model of each vehicle of the one or more vehicles driving along the one or more roadways in accordance with current traffic patterns and current communication with the one or more infrastructure devices.

15. The computer program product of claim 13, the method further comprising:

predicting, upon installation of the one or more infrastructure devices, one or more upgrades to the one or more infrastructure devices based on a continuous monitoring of new vehicle capabilities.

16. The computer program product of claim 13, wherein recommending the location of the one or more infrastructure devices further comprises:

identifying a directional alignment of the one or more infrastructure devices based on the identified one or more characteristics associated with the one or more roadways.

17. The computer program product of claim 13, wherein recommending the location of the one or more infrastructure devices further comprises:

augmenting the electronic map with a digital image overlay of the one or more infrastructure devices, wherein the digital image overlay is displayed on the electronic map at the recommended location.

\* \* \* \* \*